(12) United States Patent
Hsu et al.

(10) Patent No.: US 7,192,834 B2
(45) Date of Patent: Mar. 20, 2007

(54) LDMOS DEVICE AND METHOD OF FABRICATION OF LDMOS DEVICE

(75) Inventors: Chia-Lun Hsu, Taipei (TW); Mu-Yi Liu, Taichung (TW); Tao-Cheng Liu, Hsinchu (TW); Ichen Yang, Changhua (TW); Kuan-Po Chen, Taipei (TW)

(73) Assignee: Macronix International Co., Ltd, Hsinchu (TW)

( * ) Notice: Subject to any disclaimer, the term of this patent is extended or adjusted under 35 U.S.C. 154(b) by 0 days.

(21) Appl. No.: 11/063,932

(22) Filed: Feb. 23, 2005

(65) Prior Publication Data

US 2006/0189081 A1 Aug. 24, 2006

(51) Int. Cl.
*H01L 21/336* (2006.01)

(52) U.S. Cl. .............. 438/268; 438/199; 438/258; 438/585; 257/E21.336; 257/E21.426

(58) Field of Classification Search ............. 438/199
See application file for complete search history.

(56) References Cited

U.S. PATENT DOCUMENTS

| 6,444,550 B1 | 9/2002 | Hao et al. | |
|---|---|---|---|
| 6,448,625 B1 | 9/2002 | Hossain et al. | |
| 6,531,355 B2 | 3/2003 | Mosher et al. | |
| 6,580,131 B2 | 6/2003 | Huang et al. | |
| 2003/0215991 A1* | 11/2003 | Sohn et al. | 438/199 |

OTHER PUBLICATIONS

Zeitzoff, Peter M., "Front-End Trends, Challenges, and Potential Solutions for the 180-100 nm IC Technology Generations," Semiconductor Fabtech—10th Ed., (Pub. Date Unknown), pp. 275-281.

* cited by examiner

*Primary Examiner*—Michael Lebentritt
*Assistant Examiner*—Kyoung Lee
(74) *Attorney, Agent, or Firm*—Mark A. Haynes; Haynes Beffel & Wolfeld LLP (57) ABSTRACT

A lateral double diffused metal oxide semiconductor (LDMOS) device, and method of fabricating such a device, are provided. The method comprises the steps of: (a) providing a substrate of a first conductivity type; (b) forming within the substrate a well region of a second conductivity type, the well region having a super steep retrograde (SSR) well profile in which a doping concentration changes with depth so as to provide a lighter doping concentration in a surface region of the well region than in a region below the surface region of the well region; (c) forming a gate layer which partly overlies the well region and is insulated from the well region; and (d) forming one of a source region and a drain region in the well region. The presence of the SSR well region provides a lighter surface doping to enable a higher breakdown voltage to be obtained within the LDMOS device, and heavier sub-surface doping to decrease the on-resistance.

25 Claims, 6 Drawing Sheets

LDMOS DEVICE AND METHOD OF FABRICATION OF LDMOS DEVICE

BACKGROUND OF THE INVENTION

1. Field of the Invention

The present invention relates generally to semiconductor devices, and more particularly to a lateral double diffused metal oxide semiconductor (LDMOS) device and a method of fabricating such a device.

2. Description of the Prior Art

LDMOS devices are typically used in high voltage applications, and when designing such LDMOS devices, it is important that the device should have a very high breakdown voltage ($V_{bd}$), whilst also exhibiting, when operating, a low on-resistance (Ron). By designing LDMOS devices with low on-resistance and high breakdown voltage, such devices will typically exhibit low power loss in high voltage applications. In addition, by exhibiting a low on-resistance, a high drain current (Idsat) can be achieved when the transistor is in saturation, which increases speed of operation of the device. One problem when designing such LDMOS devices is that techniques and structures that tend to maximise $V_{bd}$ tend to adversely affect the Ron and vice versa.

In a conventional LDMOS device, a lighter concentration well doping can be provided as an N-minus (NM) region in order to reduce the electric field crowding at the gate edge. However, this lighter concentration well doping tends to increase the Ron. In order to decrease the Ron, it would be necessary to increase the doping concentration of the NM region, but in so doing the breakdown characteristic would be degraded, i.e. $V_{bd}$ would be reduced.

U.S. Pat. No. 6,448,625 B1 describes a high voltage MOS device in which an N-well region is formed with two areas. As described therein, a first N-well implant process is performed using a first mask. Then, a second N-well implant process is performed using a different mask, with this different mask being offset laterally with respect to the first mask. The second implant process uses a higher concentration implant, and this process results in a well region in which a first area has a high dopant concentration and a second area latterly offset with respect to the first area has a low dopant concentration. The lower dopant concentration in the second area is said to increase the breakdown voltage when the device is blocking voltage, whilst helping to decrease on-resistance when the device is in the "on" state.

U.S. Pat. No. 6,531,355 describes a RESURF LDMOS transistor that includes a RESURF region that is self-aligned to a LOCOS field oxide region. The self-alignment produces a stable breakdown voltage by eliminating degradation associated with geometric misalignment and process tolerance variation. For a given specific-on-resistance, this technique hence produces a RESURF LDMOS device having a stable, predictable breakdown voltage.

U.S. Pat. No. 6,580,131 B2 describes an LDMOS device having two epitaxial N-regions instead of the more traditional single exiptaxial N-region that is used in prior art devices. The lower N-layer has a resistivity that is greater than that of the upper N-layer, which is said to result in an improvement in the trade off between breakdown voltage and on-resistance.

From the above discussion, it will be appreciated that various techniques have been developed with the aim of improving the trade off between breakdown voltage and on-resistance in devices such as LDMOS devices. It would be desirable to provide a technique for manufacturing an LDMOS device which further improves this trade off.

SUMMARY OF THE INVENTION

Viewed from a first aspect the present invention provides a method of fabricating a lateral double diffused metal oxide semiconductor (LDMOS) device, comprising the steps of: (a) providing a substrate of a first conductivity type; (b) forming within the substrate a well region of a second conductivity type, the well region having a super steep retrograde (SSR) well profile in which a doping concentration changes with depth so as to provide a lighter doping concentration in a surface region of the well region than in a region below the surface region of the well region; (c) forming a gate layer which partly overlies the well region and is insulated from the well region; and (d) forming one of a source region and a drain region in the well region:

In accordance with the present invention, a well region having an SSR well profile is produced within an LDMOS device, such that a doping concentration within the well region changes with depth so as to provide a lighter doping concentration in a surface region of the well region than in a region below the surface region of the well region. This results in an SSR well region which provides a lighter surface doping to enable a higher breakdown voltage to be obtained within the LDMOS device, and heavier sub-surface doping to decrease the Ron.

In the past, super steep retrograde profiles have been produced in the channel region of a MOS device to alleviate what is referred to as the "reverse short channel effect" (an adverse effect on threshold voltage resulting from decreasing the channel length beyond a certain point). This is discussed for example in U.S. Pat. No. 6,444,550 B1 and in the article "Front-End Trends, Challenges, and Potential Solutions for the 180–100 nm IC Technology Generations" by Peter M Zeitzoff, Sematech Inc, Austin Tex., USA, Semiconductor Fabtech—10$^{th}$ Edition, pages 275–280.

In one embodiment, the step (b) comprises the step of implanting at least one element in the substrate to form the well region, with the depth of implantation being controlled so as to produce the SSR well profile. The depth of implantation can be controlled, for example, by controlling the implantation energy. This enables the doping profile within the SSR well region, and in particular the depth at which doping concentration transitions from a lighter to a heavier doping concentration, to be managed so as to meet the requirements of a particular implementation.

In one embodiment the implanting step comprises a two-stage implantation process. In one particular embodiment, the two stage implantation process comprises the steps of: implanting a first element in the substrate to form the well region of the second conductivity type; and implanting a second element in the well region to produce the SSR well profile within the well region. The depth of implantation of the second element can be controlled so as to produce a desired SSR well profile.

In one particular embodiment, the second element is heavier than the first element.

The order of implantation of the first and second elements may be reversed, such that in an alternative embodiment, the heavier element may be implanted prior to the lighter element.

In one embodiment, the first element is selected from the lighter Group VI elements and the second element is selected from the heavier Group VI elements. Hence, as an example the first element may be one of P or As, whereas the second element may be Sb. In one particular embodiment, the first element is Phosphorus (P) and the second element is Antimony (Sb).

In one embodiment the method further comprises the step of: forming in the substrate a second well region of the first conductivity type adjacent the well region of the second conductivity type. This second well region may be formed after the well region of the second conductivity type, or in an alternative embodiment may be formed before the well region of the second conductivity type.

In one embodiment, the method further comprises the step, prior to said step (b), of: forming a mask over the substrate to expose a region in which the well region of the second conductivity type is to be formed. In embodiments employing the two-stage implantation process, the mask may be retained during both stages of the two-stage implantation process. Hence, in such embodiments, during both implanting steps the implanted elements are implanted into the same region of the substrate.

The gate layer may be insulated from the substrate in a variety of ways. However, in one embodiment, the method further comprises the step of, prior to said step (c): forming a field oxide insulating layer and an adjacent gate oxide layer on the surface of the substrate, such that at said step (c) the formed gate layer is formed so as to overlie the gate oxide layer and at least a portion of the field oxide insulating layer.

In one embodiment the first conductivity type is P type and the second conductivity type is N type. In one particular embodiment, the well region of the second conductivity type is an N-minus region. Thus, the well region has a lower doping concentration than the source or drain region formed within it.

In one embodiment, the LDMOS device has an asymmetric structure in which only one of the source and drain terminals is formed within an SSR well. In particular the terminal acting to sustain high voltage will be formed within the SSR well. However, in an alternative embodiment, at said step (b) two well regions having said SSR well profile are formed, at said step (c) the gate layer is formed so as to partly overlie both of said two well regions, and at said step (d) the source region is formed in one of said two well regions and the drain region is formed in the other of said two well regions. Hence, in this alternative embodiment, the LDMOS device has a symmetric structure, with both the source and drain terminals being capable of sustaining high voltage operation.

Viewed from a second aspect, the present invention provides a method of fabricating a lateral double diffused metal oxide semiconductor (LDMOS) device, comprising the steps of: (a) providing a substrate of a first conductivity type; (b) implanting a first element in the substrate to form a well region of a second conductivity type; (c) implanting a second element in the well region to produce a super steep retrograde (SSR) well in which a doping concentration changes with depth so as to provide a lighter doping concentration in a surface region of the SSR well than in a region below the surface region of the SSR well; (d) forming a gate layer which partly overlies the well region and is insulated from the well region; and (e) forming one of a source region and a drain region in the well region.

In accordance with this aspect of the present invention, an LDMOS device is produced in which a well region is formed by implanting a first element in the substrate, and then a second element is implanted into that well region to produce a super steep retrograde well. The doping concentration within the SSR well changes with depth so as to provide a lighter doping concentration in a surface region of the SSR well than in a region below the surface region of the SSR well. The use of such a process results in an SSR well which provides a lighter surface doping to enable a higher breakdown voltage to be obtained within the LDMOS device, and heavier sub-surface doping to decrease the Ron.

Viewed from a third aspect the present invention provides a lateral double diffused metal oxide semiconductor (LDMOS) device, comprising: a substrate of a first conductivity type; a well region of a second conductivity type formed in the substrate, the well region having a super steep retrograde (SSR) well profile in which a doping concentration changes with depth so as to provide a lighter doping concentration in a surface region of the well region than in a region below the surface region of the well region; a gate layer which partly overlies the well region and is insulated from the well region; and one of a source region and a drain region formed in the well region.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

According to one embodiment of the invention, an LDMOS device having a low on-resistance whilst exhibiting a high breakdown voltage is provided. A method of fabricating such an LDMOS device in accordance with one embodiment of the present invention will now be discussed with reference to FIG. 1. For the purposes of describing the embodiment of FIG. 1, it is assumed that the substrate is a P-type substrate, and the SSR well profile is to be formed in an N-type well region. However, it will be appreciated by those skilled in that art that the dopant types of the various regions can be changed so as to produce P-type devices instead of N-type devices, and vice versa. Hence, in an alternative embodiment, the substrate may be an N-type substrate and the SSR well profile may be formed within a P-type well region.

Figure 1:
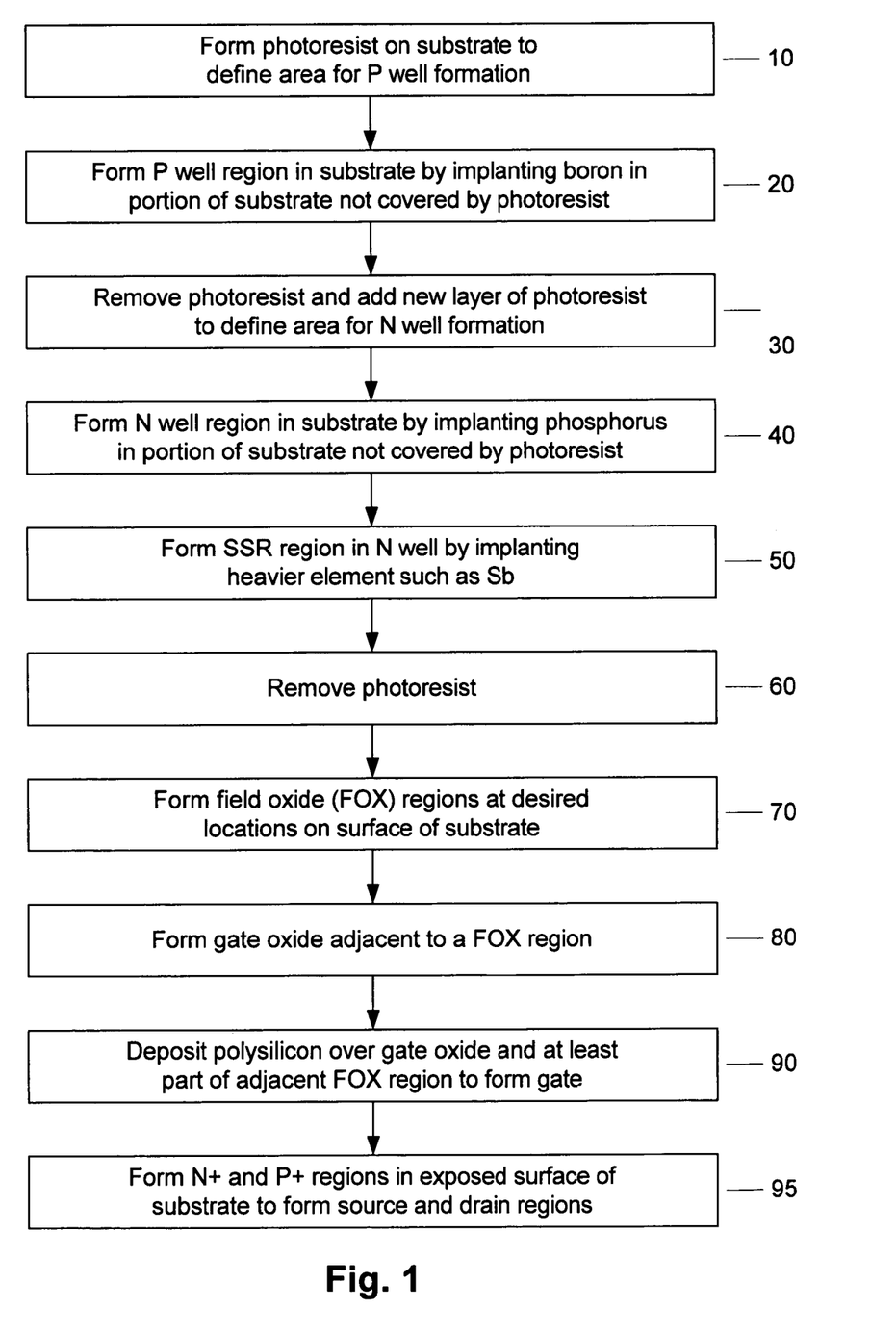
FIG. 1 is a flow diagram illustrating process steps performed in one embodiment of the present invention in order to produce an LDMOS device having a well region with an SSR well profile.

Considering now FIG. 1, at step 10 a photoresist is formed on the P-type substrate to define an area in which a P-type well region (P well) is to be formed. In particular, the area for the P well formation is defined by the gap in the photoresist. Then, at step 20, a P well region is formed in the substrate by implanting a particular element in the portion of the substrate not covered by the photo resist. In the particular example illustrated in FIG. 1, boron is used as the element implanted to form the P well, but it will appreciated by those skilled in the art that other elements could be used.

At step 30, the photoresist is then removed and a new layer of photoresist is then deposited in order to define an area for formation of an N-type well region (N well). Again, the area for the well is defined by a gap in the photoresist.

Thereafter, at step 40, the N well region is formed in the P-type substrate by implanting a suitable element into the portion of the substrate not covered by the photoresist. In the particular example illustrated in FIG. 1, Phosphorus is used as the element implanted at step 40, but it will be appreciated that other elements, for example other elements in Group VI of the periodic table, could be used.

Thereafter, with the photoresist still in place, a second implantation step 50 is performed in order to implant a heavier element into the N well region, with the depth of implantation being controlled so as to produce an SSR well profile. In the particular example illustrated in FIG. 1, the heavier element may take the form of Antimony. The depth of implantation can be controlled in a variety of ways, for example by controlling the implantation energy applied at step 50.

Then, at step 60, the photoresist is removed. At this point, the P-type substrate has both a P-type well and an N-type well formed therein, in one embodiment these two wells being adjacent each other.

At step 70, a number of field oxide (FOX) regions are formed at desired locations on the surface of the substrate. More particularly, as will be discussed later for example with reference to FIG. 2D, a central FOX region 162 is formed in the N-well region, which in the finished device will partly underlie a portion of the gate (this portion of the gate being referred to as the field plate), this relatively thick FOX region serving to increase the breakdown voltage of the device by reducing electric field crowding at the gate edge. Further, two additional FOX regions 160, 164 are formed, one at each side of the LDMOS device, which serve to isolate the device from other devices. Each of the FOX regions will typically be grown using a thermal oxidation process.

At step 80, an insulating gate oxide layer is formed adjacent to the central FOX region. The gate oxide layer may be formed using thermal oxidation or Chemical Vapour Deposition (CVD), but thermal oxidation has been found to produce a better quality gate oxide layer. Whilst the formation of the gate oxide is shown as taking place after the formation of the FOX regions, it will be appreciated that in some embodiments the gate oxide can be formed at the same time as the FOX regions, or indeed can be formed prior to formation of the FOX regions.

At step 90, a polysilicon gate layer is formed over the gate oxide and at least part of the adjacent FOX region. The gate layer can be formed using any one of a number of known techniques in the art. For example, a doped polysilicon gate layer may be formed using a thermal or CVD process. Then lithography is typically applied and finally an etching process is applied, for example an anisotropic etching to pattern the gate.

Finally, at step 95, N+ and P+ regions are formed in the exposed surface of the substrate (i.e. those portions not covered by the FOX regions or by the polysilicon gate and gate oxide layers). In particular, an N+ doped region may be formed within the N-type well in order to form a drain region, and a second N+ doped region can be formed in the P well in order to form a source region. In addition, with regard to the N+ region formed in the P well, an adjacent P+ pickup region may be provided to reduce resistivity. The various regions formed at step 95 may be produced through conventional masking steps by selective doping of the substrate in the required regions. The selective doping process may be performed with any conventional method, such as diffusion and ion implantation.

Figure 2A:
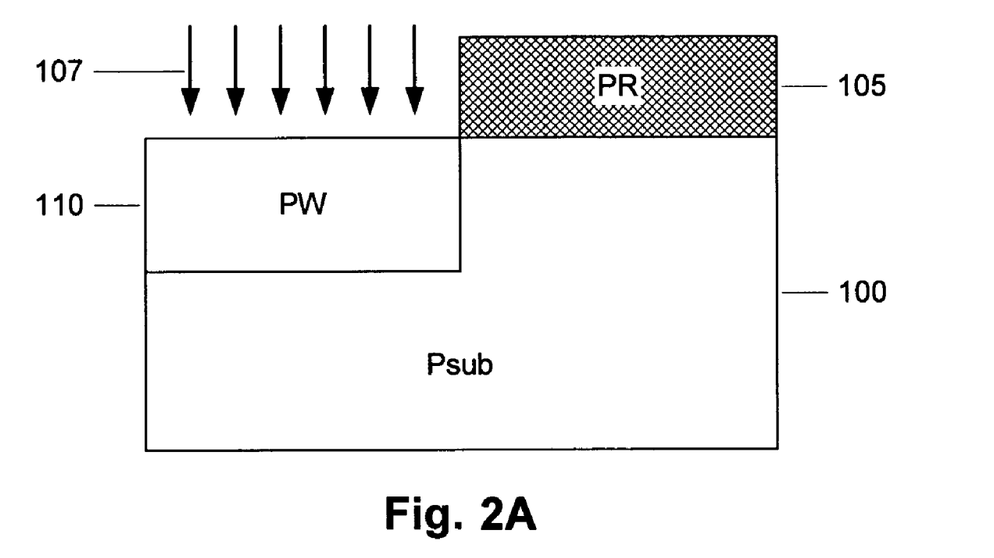
FIGS. 2A to 2F are cross-sectional diagrams schematically illustrating the formation of the LDMOS device in accordance with the method of FIG. 1, FIG. 2F illustrating the resultant LDMOS device.

FIGS. 2A to 2F are cross-sectional diagrams illustrating the production of an LDMOS device using the earlier-described method of FIG. 1. FIG. 2A shows the formation of a first photoresist 105 on the substrate 100 and the subsequent step of employing an implantation process 107 to form a P-type well 110 (see steps 10 and 20 of FIG. 1).

Figure 2B:
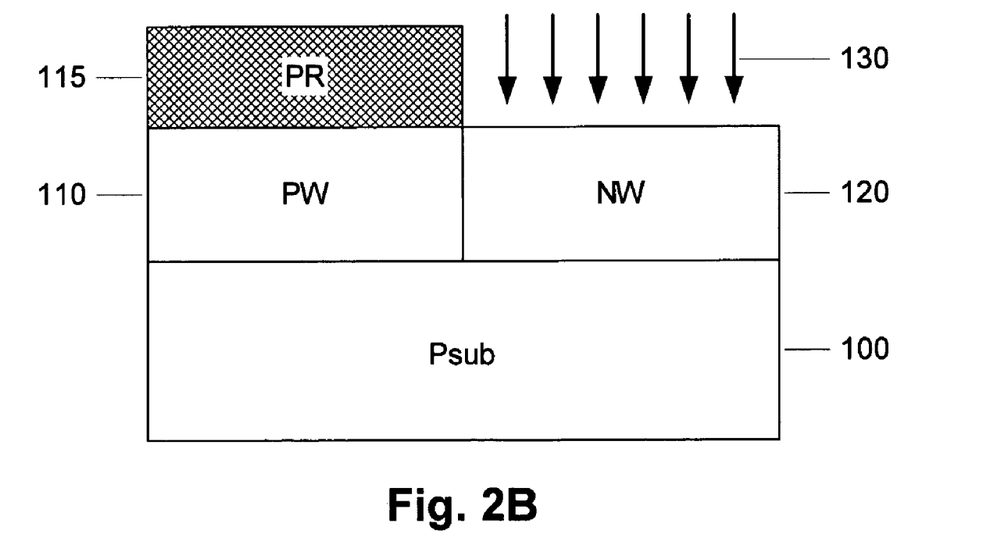

FIG. 2B shows the subsequent formation of a second photoresist 115 overlying the P-type well 110, followed by the subsequent implantation process 130 in order to form an N-type well 120 adjacent to the P-type well 110 (see steps 30 and 40 of FIG. 1).

Figure 2C:
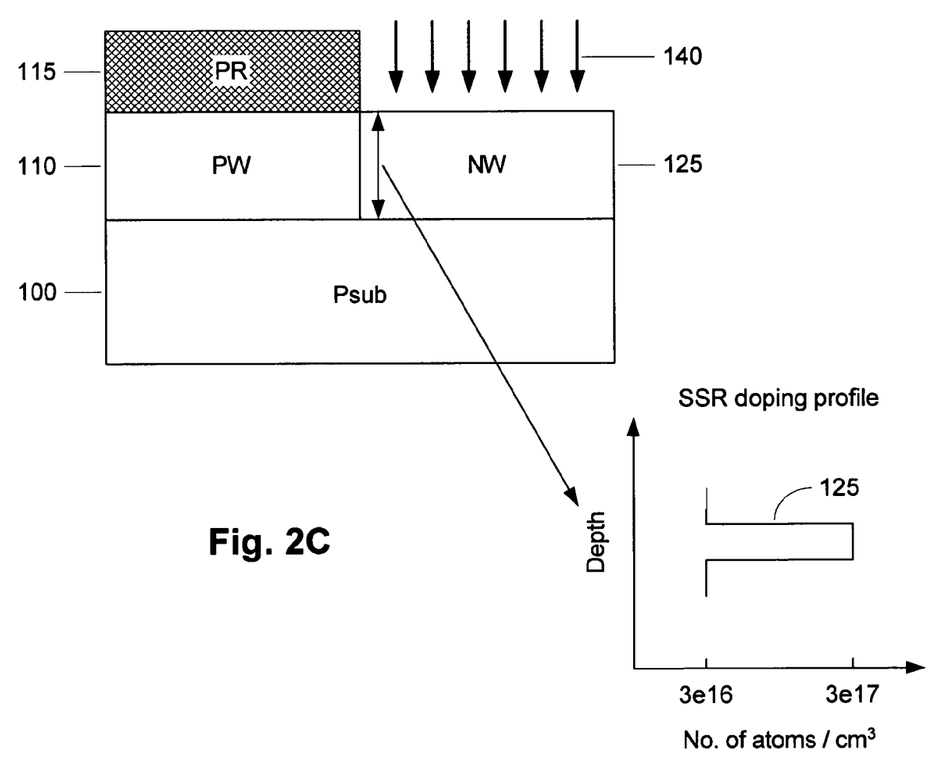

FIG. 2C then illustrates the use of a second implantation process 140 using the same photoresist 115 as a mask, in order to produce a modified N-type well 125 having an SSR well profile. In particular, the implantation process 140 uses a heavier element than that implanted in the earlier implantation process 130 in order to produce a doping concentration profile 150 that changes with depth through the N-type well. In particular, as shown in FIG. 2C, in the example SSR doping profile illustrated therein, the doping profile within the N-well is 3e16 atom/cm3 except for in a particular central region where the doping concentration increases to 3e17 atom/cm3 due to the implantation of the heavier element into that central region. The exact depth of implantation of this heavier second element can be controlled, for example by controlling the implantation energy, in order to produce the desired SSR well profile for a particular implementation. The process illustrated schematically by FIG. 2C is equivalent to that discussed with reference to step 50 of FIG. 1.

Figure 2D:
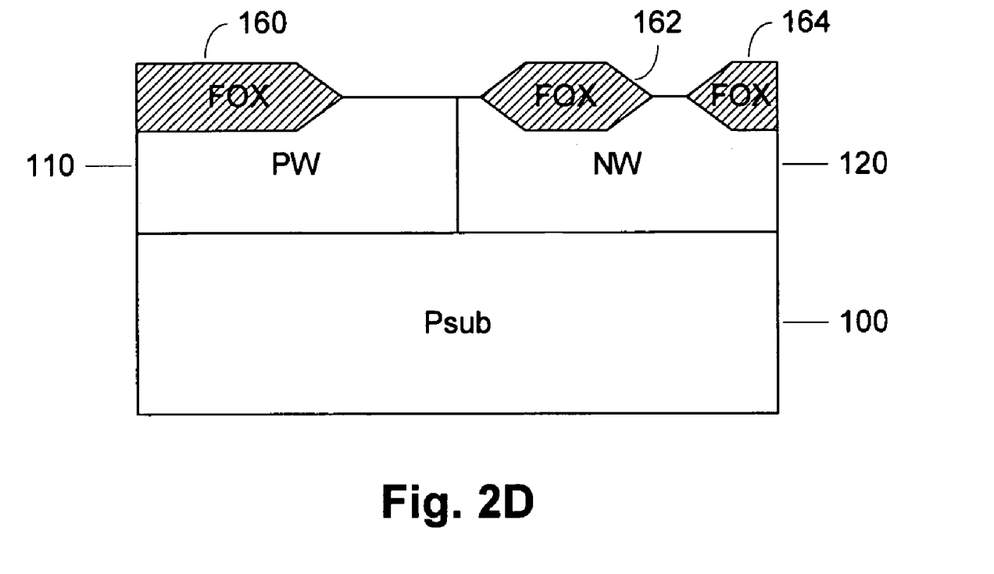

FIG. 2D then illustrates the formation of three FOX regions 160, 162 and 164 within the surface of the substrate (see step 70 of FIG. 1). The FOX regions 160 and 164 serve to isolate the LDMOS device from adjacent devices, whilst the FOX region 162 is used to provide a relatively thick insulating portion to underlie part of the gate.

Figure 2E:
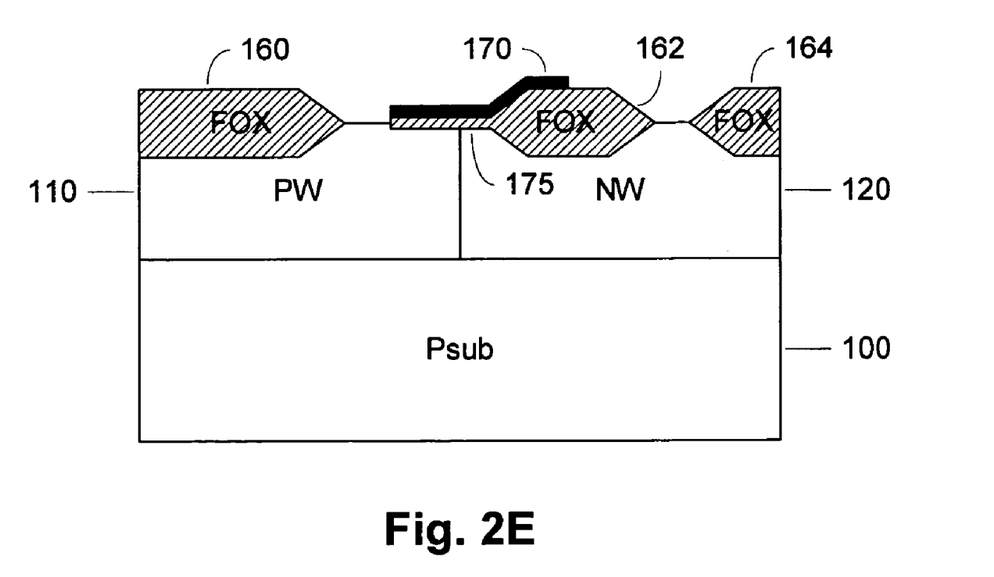

FIG. 2E illustrates the formation of a gate oxide layer 175 adjacent to the FOX region 162, whereafter a polysilicon gate layer 170 is formed over the gate oxide 175 and part of the FOX region 162 (see steps 80 and 90 of FIG. 1).

Figure 2F:
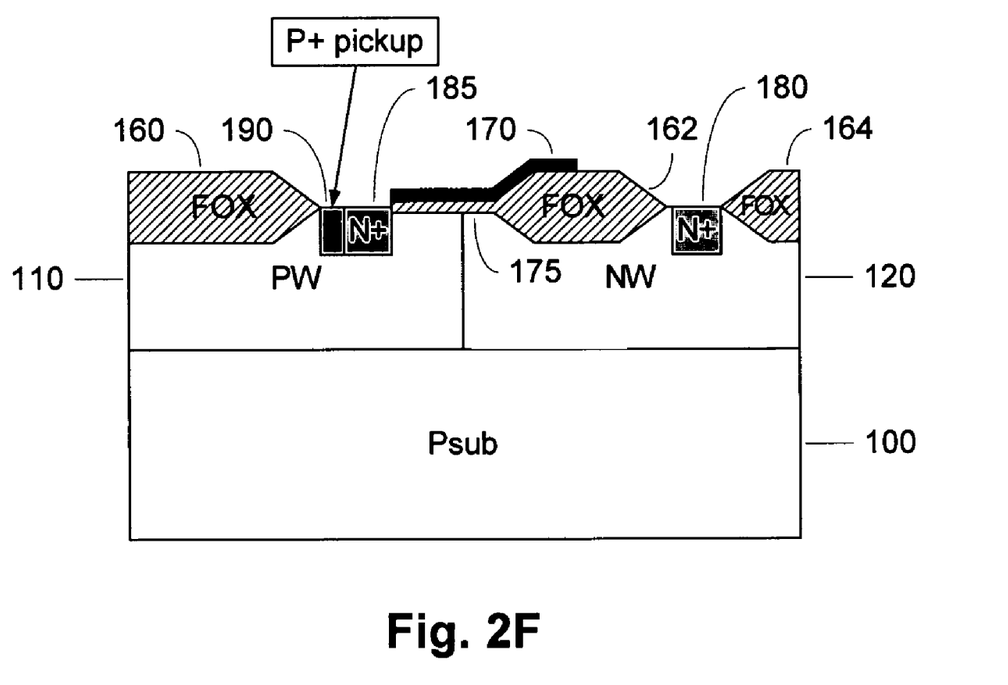

FIG. 2F then illustrates the formation of an N+ drain region 180 and N+ source region 185 with adjacent P+ pickup region 190, within the substrate. FIG. 2F hence illustrates the final form of the LDMOS device, in which a drain terminal would be attached at region 180, a gate terminal would be attached to the polysilicon layer 170, and a source terminal would be attached to the source region 185.

The N-type well region 120, with its associated SSR doping profile, provides a light surface doping to enable a higher breakdown voltage to be obtained within the LDMOS device, and heavier sub-surface doping to decrease the on-resistance. The terminal acting to sustain high voltage will be formed within the SSR well. Hence, in the example of FIG. 2F, the drain region 180 is formed within the N-type well. However, alternatively, the source region could be formed within the N-type well, and the drain region could be formed within the P-type well, if the source terminal were to act to sustain high voltage.

Figure 3:
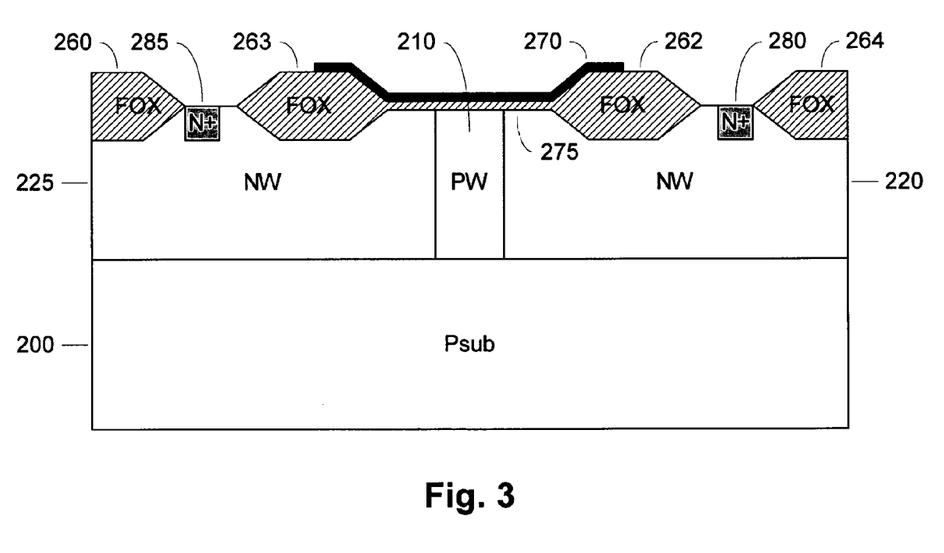
FIG. 3 is a cross-sectional diagram illustrating an LDMOS device in accordance with a second embodiment of the present invention.

FIG. 3 illustrates an LDMOS device in accordance with an alternative embodiment of the present invention, in which the LDMOS device has a symmetric structure, such that both the source and drain regions are placed within respective N-type well regions, both of which are formed with an SSR doping profile. In particular, as shown in FIG. 3, a P-type substrate 200 has a P-type well 210 formed therein, and then on each side of the P-type well 210 N-type well regions 220, 225 are formed. Each N-type well region 220, 225 is formed with an SSR doping profile, for example by using the two-stage implantation process discussed earlier with reference to steps 40 and 50 of FIG. 1.

FOX regions 260, 264 correspond to FOX regions 160, 164 of the earlier described FIGS. 2A to 2F, but now instead of a single central FOX region, two central FOX regions 262, 263 are formed, one within each N-type well region 220, 225, respectively. An insulating gate oxide layer 275 extends between the two central FOX regions 262, 263, and a polysilicon gate layer 270 is then formed overlying that gate oxide layer and partly overlying each FOX region 262, 263. N+ regions 280, 285 are then formed in the exposed substrate of the two N-type well regions 220, 225 to form drain and source regions, respectively. In such a symmetric embodiment as illustrated in FIG. 3, both the source and drain terminals are then capable of sustaining high voltage operation.

In accordance with the above described embodiments of the present invention, it will be appreciated that such embodiments enable the production of an LDMOS device with an increased saturation current (Idsat) due to the heavy sub-surface doping concentration in the SSR well region, whilst retaining high breakdown voltage characteristics due to the light surface doping concentration in the SSR well region. The formation of the SSR doping profile within the N well region can be performed without significantly increasing the complexity of the manufacturing process, and it has been found that the SSR concentration profile is retained even though some thermal processes are applied afterwards, for example to form the FOX regions. In one particular embodiment, the SSR well is formed by implantation of a heavy dopant to produce a desired doping profile that is not unduly disturbed by the following thermal budget.

Such an LDMOS device has application in a wide variety of types of integrated circuit. In particular, such LDMOS devices are usefully employed in integrated circuits requiring the sustaining of a high breakdown voltage, for example as is required in an LCD driver.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of fabricating a lateral double diffused metal oxide semiconductor (LDMOS) device, comprising the steps of:
   (a) providing a substrate of a first conductivity type;
   (b) forming within the substrate a well region of a second conductivity type, the well region having a super steep retrograde (SSR) well profile in which a doping concentration changes with depth so as to provide a lighter doping concentration in a surface region of the well region than in a region below the surface region of the well region;
   (c) forming a gate layer which partly overlies the a portion of the substrate of the first conductivity type adjacent to the well region, said portion including a channel for the LDMOS device, and partly overlies the well region and is insulated from the well region; and
   (d) forming one of a source region and a drain region in the well region, and the other of the source region and the drain region in said portion of the substrate.

2. A method as claimed in claim 1, wherein said step (b) comprises the step of implanting at least one element in the substrate to form the well region, with the depth of implantation being controlled so as to produce the SSR well profile.

3. A method as claimed in claim 2, wherein the implanting step comprises a two-stage implantation process.

4. A method as claimed in claim 3, wherein the two-stage implantation process comprises the steps of:
   implanting a first element in the substrate to form the well region of the second conductivity type; and
   implanting a second element in the well region to produce the SSR well profile within the well region.

5. A method as claimed in claim 4, wherein the second element is heavier than the first element.

6. A method as claimed in claim 5, wherein the first element is selected from the lighter Group VI elements and the second element is selected from the heavier Group VI elements.

7. A method as claimed in claim 6, wherein the first element is Phosphorus (P) and the second element is Antimony (Sb).

8. A method as claimed in claim 1, further comprising the step of:
   forming in the substrate a second well region of the first conductivity type adjacent the well region of the second conductivity type.

9. A method as claimed in claim 1, further comprising the step, prior to said step (b), of:
   forming a mask over the substrate to expose a region in which the well region of the second conductivity type is to be formed.

10. A method as claimed in claim 3, further comprising the step, prior to said step (b) of:
    forming a mask over the substrate to expose a region in which the well region of the second conductivity type is to be formed; and
    retaining the mask during both stages of the two-stage implantation process.

11. A method of fabricating a lateral double diffused metal oxide semiconductor (LDMOS) device, comprising the steps of:
    (a) providing a substrate of a first conductivity type;
    (b) forming within the substrate a well region of a second conductivity type, the well region having a super steep retrograde (SSR) well profile in which a doping concentration changes with depth so as to provide a lighter doping concentration in a surface region of the well region than in a region below the surface region of the well region;
    (c) forming a gate layer which partly overlies the a portion of the substrate of the first conductivity type adjacent to the well region and partly overlies the well region and is insulated from the well region; and
    (d) forming one of a source region and a drain region in the well region, further comprising the step of, prior to said step (c):
    forming a field oxide insulating layer and an adjacent gate oxide layer on the surface of the substrate, such that at said step (c) the formed gate layer is formed so as to overlie the gate oxide layer and at least a portion of the field oxide insulating layer.

12. A method as claimed in claim 1, wherein the first conductivity type is P type and the second conductivity type is N type.

13. A method as claimed in claim 12, wherein the well region of the second conductivity type is an N-minus region.

14. A method as claimed in claim 1, wherein at said step (b) two well regions having said SSR well profile are formed separated by said portion of the substrate of the first conductivity type, at said step (c) the gate layer is formed so as to partly overlie both of said two well regions and said portion of the substrate, and at said step (d) the source region is formed in one of said two well regions and the drain region is formed in the other of said two well regions.

15. A method of fabricating a lateral double diffused metal oxide semiconductor (LDMOS) device, comprising the steps of:
   (a) providing a substrate of a first conductivity type;
   (b) implanting a first element in the substrate to form a well region of a second conductivity type;
   (c) implanting a second element in the well region to produce a super steep retrograde (SSR) well in which a doping concentration changes with depth so as to provide a lighter doping concentration in a surface region of the SSR well than in a region below the surface region of the SSR well;
   (d) forming a gate layer which partly overlies a portion of the substrate of the first conductivity type adjacent to the well region, said portion including a channel for the LDMOS device, and partly overlies the well region and is insulated from the well region; and
   (e) forming one of a source region and a drain region in the well region, and the other of the source region and the drain region in said portion of the substrate.

16. A method of fabricating a lateral double diffused metal oxide semiconductor device on a substrate having a first conductivity type, comprising the steps of:
   forming within the substrate first and second well regions, with the first well region having the first conductivity type and the second well region having a second conductivity type and a super steep retrograde well profile, with the super steep retrograde well profile being absent from the first well region and sections of the substrate in superimposition therewith;
   forming a gate layer which is in superimposition with both the first and second well regions and spaced apart therefrom by dielectric material; and
   forming one of a source region and a drain region in one of the first and second well regions.

17. The method as recited in claim 16 wherein forming within the substrate further includes implanting into the second well region Phosphorous (P) and Antimony (Sb) elements.

18. The method as recited in claim 16 wherein forming one of the source region and the drain region further includes fabricating said one of the source region and the drain region in the second well region, while maintaining the SSR well profile in portions of the second well region on opposing sides of said one of the source region and the drain region.

19. The method as recited in claim 16 wherein the first conductivity type has a charge opposite to the charge associated with the second conductivity type.

20. The method as recited in claim 16 wherein forming within the substrate further includes implanting a first element in the substrate to form the second well region of the second conductivity type; and
   implanting a second element into the second well region.

21. The method as recited in claim 20 wherein the second element is heavier than the first element.

22. The method as recited in claim 21 wherein the first element is Phosphorus (P) and the second element is Antimony (Sb).

23. The method as recited in claim 16 further including forming an additional well region having the second conductivity type, with forming the gate layer further including extending the gate layer so as to be in superimposition with, and spaced apart from, the first, second and additional wells regions.

24. The method as recited in claim 23 wherein forming said first well region further includes fabricating the first well region between said second and additional well regions.

25. The method as recited in claim 23 wherein forming said first well region further includes fabricating the first well region so as to be centrally disposed between the second and additional well regions.

* * * * *

UNITED STATES PATENT AND TRADEMARK OFFICE
CERTIFICATE OF CORRECTION

| | | |
|---|---|---|
| PATENT NO. | : 7,192,834 B2 | Page 1 of 1 |
| APPLICATION NO. | : 11/063932 | |
| DATED | : March 20, 2007 | |
| INVENTOR(S) | : Chia-Lun Hsu et al. | |

It is certified that error appears in the above-identified patent and that said Letters Patent is hereby corrected as shown below:

In claim 1, column 7, line 56, delete the word "the".

In claim 11, column 8, line 46, delete the word "the".

Signed and Sealed this

Eighteenth Day of September, 2007

JON W. DUDAS
*Director of the United States Patent and Trademark Office*